United States Patent
Bergstedt et al.

(12) 
(10) Patent No.: US 6,459,347 B1
(45) Date of Patent: Oct. 1, 2002

(54) METHOD FOR VERTICAL CONNECTION OF CONDUCTORS IN A DEVICE IN THE MICROWAVE RANGE

(75) Inventors: Leif Bergstedt, Sjömarken; Katarina Boustedt, Torslanda, both of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/384,222

(22) Filed: Aug. 27, 1999

(30) Foreign Application Priority Data

Aug. 28, 1998 (SE) ............................................. 9802899

(51) Int. Cl.[7] ................................................ H01P 3/08
(52) U.S. Cl. ...................... 333/246; 333/247; 333/260
(58) Field of Search ................................ 333/246, 247, 333/260

(56) References Cited

U.S. PATENT DOCUMENTS

| | | | |
|---|---|---|---|
| 3,218,584 A | 11/1965 | Ayer | 333/246 |
| 3,303,439 A | 2/1967 | Fulp | 333/246 |
| 5,644,276 A | 7/1997 | Sturzebecher et al. | 333/236 |

FOREIGN PATENT DOCUMENTS

| | | |
|---|---|---|
| EP | 0 069 102 | 1/1983 |
| EP | 0 318 311 | 5/1989 |

*Primary Examiner*—Benny Lee

(57) ABSTRACT

Conductors extend parallel to one another in a device in the microwave range. Each conductor includes a conductive layer, a layer of a dielectric material and a ground plane. The ground planes of the two conductors are separated in the device by a core made of a dielectric material. The various layers are arranged on one another in the desired order, and a cavity is arranged in the device, extending from that layer in the first conductor which is to be connected to the second conductor, at right angles to the main direction of this layer, up to and including the layer on which the conductive layer of the second conductor is to lie. A component including a stripline conductor is arranged in the cavity, the component being arranged so that electrical contact is brought about between the conductor of the component and that layer in the first conductor which is to be connected to the second conductor. Subsequently, the conductive layer of the second conductor and its remaining ground plane and dielectric layer are arranged on the device so that the electrical contact is brought about between the conductor of the component and the conductive layer of the second conductor.

6 Claims, 4 Drawing Sheets

METHOD FOR VERTICAL CONNECTION OF CONDUCTORS IN A DEVICE IN THE MICROWAVE RANGE

TECHNICAL FIELD

The present invention relates to a method for vertical connection of conductors in devices, preferably circuit boards, in the microwave range. The method is intended in particular to be applied in antenna constructions.

BACKGROUND

A common way of building circuit boards is what is known as the multilayer technique, which means that the circuit board consists of a number of layers, where layers comprising a pattern made of an electrically conductive material are arranged on layers of dielectric material. Certain of the layers of electrically conductive material may also be intended to be used as a ground plane, in which case the layer is usually designed as a rectangular plate For the functioning of the circuit board, it may be necessary to interconnect certain of the various layers at points where it is desirable to have electrical contact. The known ways of making these connections include what are known as coplanar connections and non-galvanic connections. These known ways will be described below.

Coplanar connections can be made either by conductive wires ("bond wires") or what are known as via-holes. Via-holes are holes which are drilled or made in another manner vertically in the circuit board between the points which are to be connected. The holes are made electrically conductive by being entirely or partly filled with a conductive material. In the case of bond wires, as their name indicates, two points are interconnected by means of wires made of a conductive material. Both these methods for coplanar connections have limitations with regard to the upper operating frequency, which is a distinct disadvantage, above all in applications in the higher microwave range.

Broadly speaking, non-electrical connections are applied exclusively in the microwave range, for connections between conductors which are made using microstrip technology or stripline technology. This type of connection means that two conductors which are to be interconnected are positioned at a certain distance from one another in such a manner that one conductor acts on the other conductor by radiation. Disadvantages of this method of interconnecting conductors are that it results in relatively great losses, and that it has limitations with regard to how great the distance between the two conductors can be.

A disadvantage shared by coplanar connections and non-galvanic connections is moreover that these types of connection are difficult to design so that they give the desired impedance.

SUMMARY

A problem which is solved by means of the present invention is therefore that of making a vertical connection between two conductors in a circuit board or another device in the microwave range, where the connection can be designed so that it is imparted a certain impedance which is broadly speaking unaffected by the length of the connection.

Another problem which is solved by means of the present invention is that of making a vertical connection between two conductors in a circuit board or another device in the microwave range, which connection has low losses.

These two problems are solved by means of a method for connection of a first and a second conductor in a circuit board or another device in the microwave range, where each conductor comprises at least one conductive layer, one layer of a dielectric material and one ground plane, where the ground planes of the first and the second conductor are separated from one another in the device by at least a first core made of a dielectric material.

Furthermore, by means of the invention, at least one stage In the manufacture of previously known vertical connections in circuit boards or other electronic devices in the microwave range is eliminated.

According to the method, the various layers in the first conductor, the first core made of dielectric material of the device, and the at least one ground plane and the dielectric layer of the second conductor are arranged on one another in the desired order. A cavity is arranged in the device, extending from fat layer in the first conductor which is to be connected to the second conductor, and at right angles to the main direction of this layer, up to and including that layer in the device on which the conductive layer of the second conductor is to lie.

A component comprising a stripline conductor is arranged in the cavity, The component is arranged so that electrical contact is brought about between the conductor of the component and that layer in the first conductor which is to be connected to the second conductor. Subsequently, the conductive layer of the second conductor and any remaining dielectric layer and any remaining ground plane it has are arranged on the device so that electrical contact is brought about between the conductor of the component and the conductive layer of the second conductor.

The cavity is preferably arranged in the device by each of the layers through which the cavity is to extend having cavities before each respective layer is mounted on the device.

As an alternative, the cavity can be made in the device through the layers through which the cavity is to extend after said layers have been arranged on one another in the desired order.

In a preferred embodiment, the component and the cavity are designed so that, when the component is arranged in the cavity, each of the two ground planes in the stripline conductor of the component will interconnect ground planes in the first and the second conductor. This can of course take place in a number of different ways but is effected in a preferred embodiment by giving the component a design with a central portion which, in the direction In which the conductors are to be connected, projects further at both its ends than two surrounding outer portions.

In a further preferred embodiment the first conductor in the device is a stripline conductor and the second conductor in the device is a microstrip conductor or a stripline conductor.

BRIEF DESCRIPTION OF THE DRAWINGS

The invention will be described in greater detail below with the aid of examples of embodiments and with reference to the appended drawings, in which.

DETAILED DESCRIPTION

Figure 1:
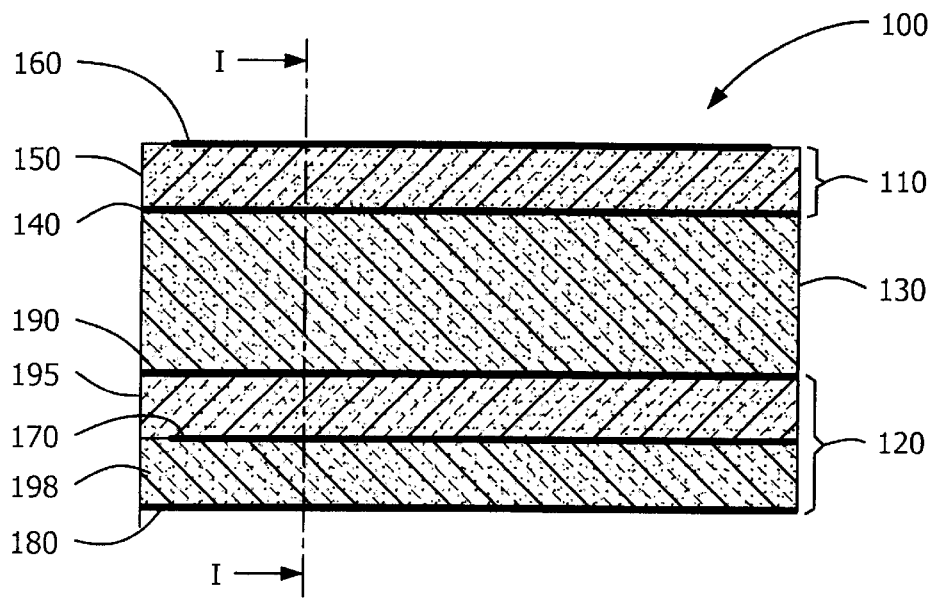
FIG. 1 shows a cross section from the side of the type of circuit board in which conductors are to be connected by means of the invention.

FIG. 1 shows a simplified cross section from the side of a device 100 intended for use in the microwave range. The device comprises two conductors which are to be connected, in the example shown a microstrip conductor 110 and a stripline conductor 120. The two conductors 110, 120 are arranged one on each side of a plane core 130 made of dielectric material and extend parallel to one another in a common main direction.

Possible areas of application of the device 100 in FIG. 1 include what is known as antenna-integrated electronics, where the stripline conductor forms part of what is known as a distribution network in order to feed antenna units with power, and the microstrip conductor is used in order to connect electronic components. In such applications, it may be highly desirable to make a connection between the feed network and the electronic components.

The microstrip conductor 110 in the device comprises a ground plane 140, a layer 160 of a dielectric material, and a conductive layer 160. The stripline conductor 120 in the device comprises a conductive layer 170, two layers 195, 198 of dielectric material located one on each side of the conductive layer 170, and two ground planes 180, 190 which are in turn located one on each side of the layers 195, 198 of dielectric material.

The ground planes 140, 180, 190 in both conductors are made from an electrically conductive material, for example copper.

The two conductors shown in the device In FIG. 1 and described below consist. as mentioned, of a microstrip conductor 110 and a stripline conductor 120. It should be emphasized. however, that the invention can be applied to any combinations of these two types of conductor.

Figure 2:
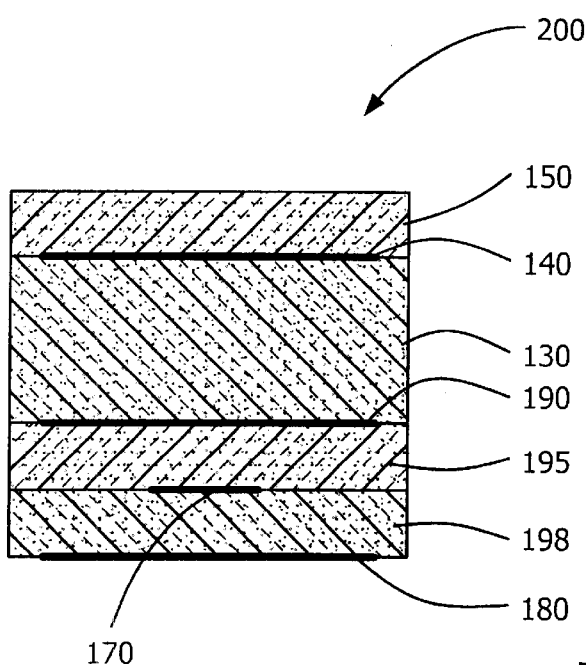
FIG. 2 shows a cross section from the front of a circuit board as viewed along line 1—1 of FIG. 1 in which conductors are to be connected by means of the invention.

FIG. 2 shows a cross section along the line 1—1 of the device in FIG. 1 during a stage of production of the device, indicated by the reference number 200. As the manufacture of devices of this type can be carried out in a number of ways well known to the person skilled in the art, the manufacture itself will not be described further here.

As can be seen from the drawing, in the stage of production of the device shown in FIG. 2, all the conductive layers 180, 190, 170, and dielectric layers 195, 198 in the stripline conductor, the core 130 made of dielectric material of the device, and the ground plane 140 and the layer 150 of dielectric material of the microstrip conductor have been arranged.

Figure 3:
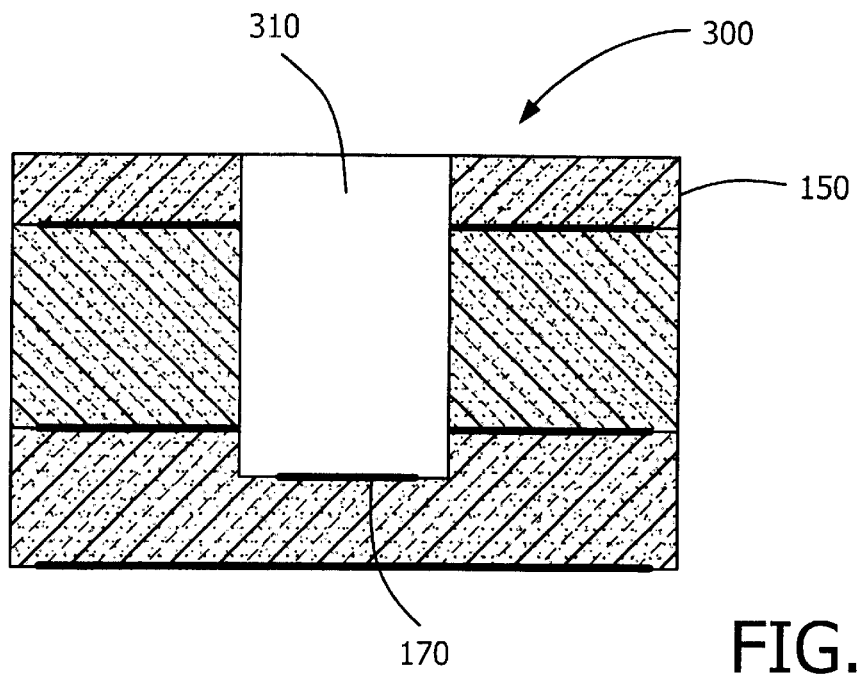
FIG. 3 shows a cross section from the front of a circuit board in which a component according to the invention is to be arranged, seen during a stage of the invention.

FIG. 3 shows the device from FIG. 2 at a later stage of production, indicated by the reference number 300. According to the invention, there is a cavity 310 in the device at this stage of the method. This cavity 310 extends from the conductive layer 170 of the stripline conductor, essentially at right angles to the main direction of this layer, up to and including the dielectric layer 150 of the microstrip conductor.

The cavity 310 is preferably arranged in the device 600 by each of the corresponding conductive or dielectric layers 198, 170, 195, 190, 130, 140, 150 through which the cavity is to extend already having cavities in corresponding places before each respective layer is mounted on the device.

As an alternative, the cavity can be made in the device through the layers through which the cavity is to extend after said layers have been arranged on one another in the desired order. Etching and laser-drilling may be mentioned as examples of ways of forming cavities according to this alternative.

Figure 4:
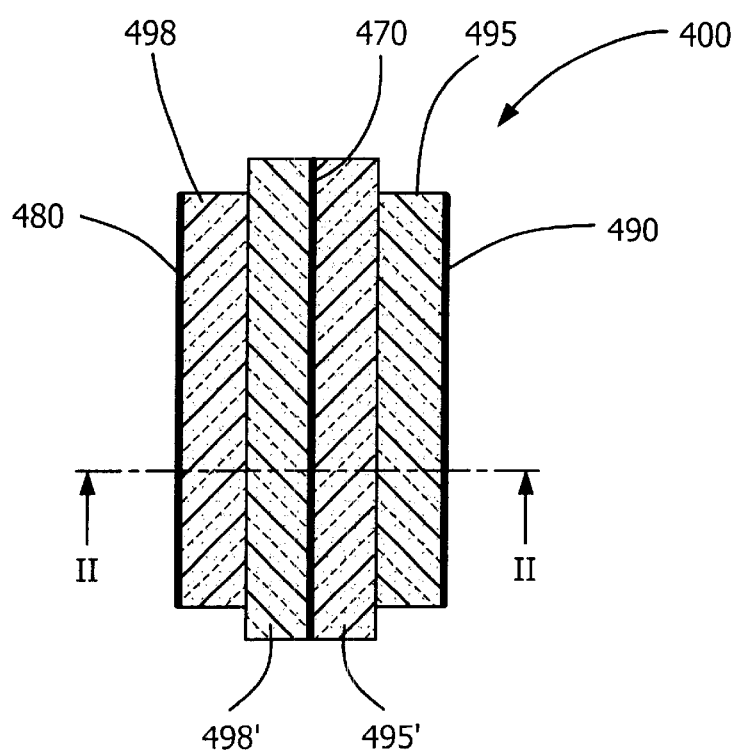
FIG. 4 shows a component for use according to the invention, seen from the front in the longitudinal direction of the conductors the component is intended to connect.

FIG. 4 shows a component 400 intended for use in connection with the method according to the invention, seen in the same plane as the device in FIGS. 2 and 3. The component 400 comprises a stripline conductor which in turn comprises a conductive layer 470 surrounded on each side by a respective layer 498, 498'; 495, 495' of a dielectric material, which layers are surrounded on each side by corresponding ground planes 480, 490. As can be seen from FIG. 4, the component 400 is designed with a central portion and two outer portions, where the central portion has a greater extent in one direction than the outer portions. The reason for this design will emerge from the description below.

The central portion comprises the conductive layer 470 of the stripline conductor and, on each side of this, a part 498', 495' of one of the dielectric layers of the stripline conductor. Each outer portion of the component comprises one of the two ground planes 480, 490 and a part 498, 495 of one of the dielectric layers of the stripline conductor.

Figure 5:
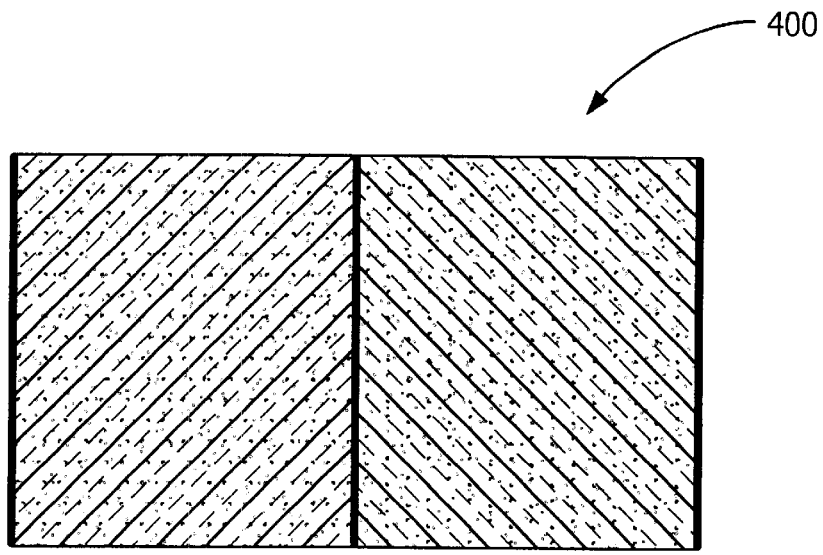
FIG. 5 shows the component from FIG. 1 seen from above as viewed along line 11—11 of FIG. 4 relative to the device in which the component is to be arranged.

FIG. 5 shows the component 400 from FIG. 4 seen along the line 11—11 in FIG. 4. As can be seen from FIG. 5, the component is essentially rectangular when seen along this line.

Figure 6:
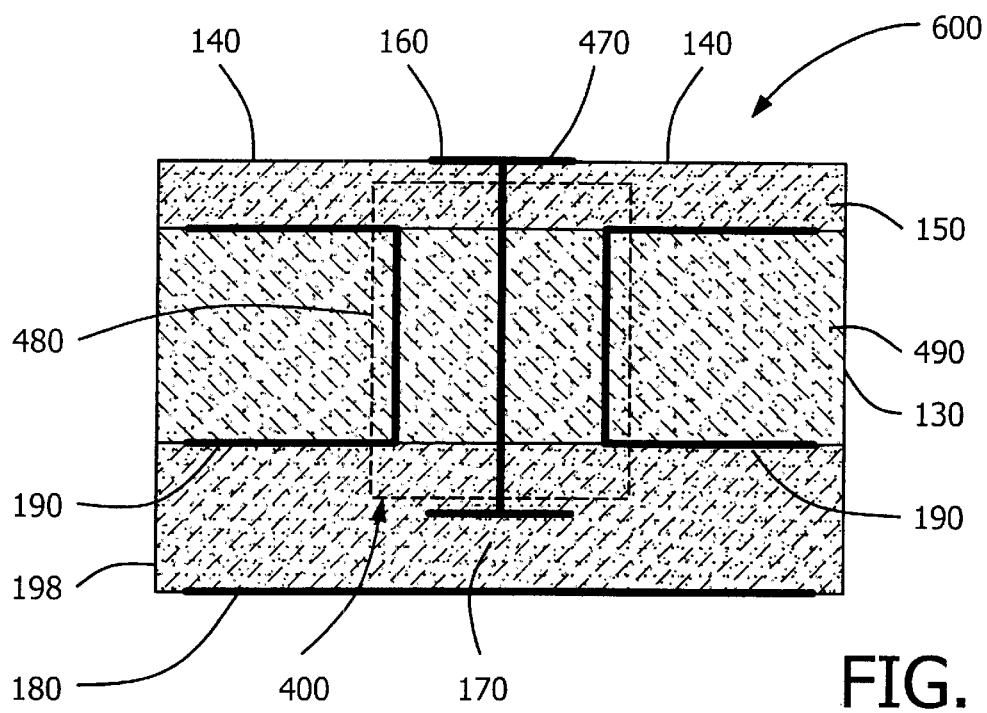
FIG. 6 shows a cross section from the front of a circuit board in which conductors have been connected by means of the invention.

Finally, FIG. 6 shows a device 600 made according to the invention, seen along the same line as in FIGS. 2 and 3. The component 400 has been positioned in the cavity, which according to the invention has been made in the device, in such a manner that electrical contact is brought about between the conductor 470 of the component and the conductive layer 170 in one of the conductors to be interconnected, in FIG. 6 the stripline conductor. The extent of the component 400 in the device Goo is shown roughly by a broken line.

After the component 400 has been positioned in the cavity in the manner described above, the conductive layer 160 in the second of the conductors to be interconnected is arranged on top of the device 600. In the example shown, the second conductor consists of the microstrip. As in FIG. 2, layer 180 is a conductive layer.

As can also be seen from FIG. 6, the component 400 and the cavity according to the invention have been designed so that when the component has been positioned in the cavity of the device, each of the two ground planes 480, 490 of the component connects the ground plane 140 of the microstrip conductor to the most closely situated ground plane 190 of the stripline conductor. As a result of this design, an electromagnetic screen is formed in the longitudinal direction of the two conductors on each side of the connection which according to the invention is made between the two conductors.

By means of the invention, it has therefore been possible to make a vertical connection between two conductors in a device in the microwave range. The connection can be adapted to the distance existing between the two conductors to be interconnected, with retained performance of the connection.

Furthermore, the connection can be designed so that it is imparted the desired impedance without any influence on its performance in other respects. It may, for example, be desirable for the connection to have the same impedance as the two conductors which are being interconnected. As it is well-known to the person skilled in the art how a stripline element is designed in order to give it a certain impedance, this design will not be described further here.

The component 400 is fixed in the device 600 in connection with the fixing of the layers which constitute the device. This can take place in a number of ways well-known to the person skilled in the art, for example by means of pressure or heat or a combination of these. In this way, the invention reduces the number of stages involved in manufacturing the device.

Electrical contact between the conductor 470 of the component and the two conductors 160, 170 can be brought about either by good mechanical contact between the conductors 160, 170 and the conductor 470 of the component or, if appropriate, by arranging, on one or more of the surfaces between which it is desired to have electrical contact, a means of a type known per se for facilitating electrical contact, for example a conductive epoxy adhesive which sets in connection with the heat-treatment referred to above. Corresponding measures for electrical contact can also be taken with regard to the ground planes of the component and the device. In order to ensure that good contact is achieved, the conductor 470 of the component and its ground planes 480, 490 can, if appropriate, be designed with slightly greater dimensions than corresponding parts of the device, which is shown in FIGS. 4–6.

Figure 7:
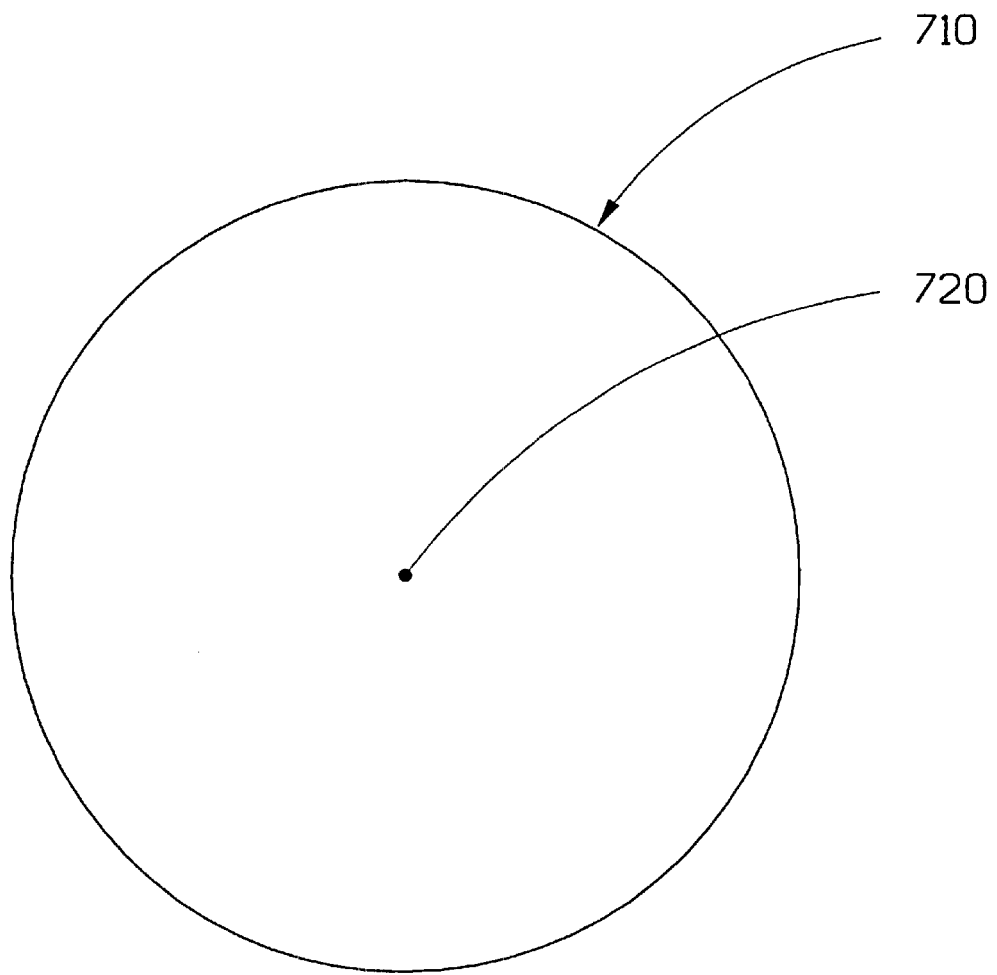
FIG. 7 shows an alternative embodiment of a component for use according to the invention, seen in the same section as the component in FIG. 5.

In an alternative embodiment the component according to the invention can be designed with a ground plane which forms a closed shape around the conductor of the component Such a closed ground plane can be of circular design, which is shown in FIG. 7, seen in the same plane as the component in FIG. 5. An advantage of such a design of the ground plane 710 is that a continuous screen is formed around the conductor 720 of the component The invention is not limited to the examples of embodiments shown above but can be varied freely within the scope of the patent claims below.

As mentioned previously, for example, the invention can be applied to any combination of conductors of the stripline and microstrip types. Furthermore, the word "vertical" has been used throughout the description above in order to describe the direction in which the two conductors are connected according to the invention. It should be emphasized, however, that the word "vertical" means the direction which is vertical if the device is positioned in the manner shown in FIG. 6. In other words, the direction which is meant is a direction which is at right angles to the main direction of the two conductors and defines the shortest distance between the two conductors.

Above, the component 400 according to the invention has throughout been described as a passive component which is used only to interconnect two conductors. It is of course also possible for the component to be active and comprise, for example, an amplifier or another active component

What is claimed is:

1. Method for connecting first and second conductors which extend in a main direction parallel to one another and form part of a device in the microwave range, wherein each of the first and the second conductors respectively comprise at least one conductive layer, at least one layer of a dielectric material and at least one ground plane, the ground planes of the first and the second conductor being separated in the device by at least a first core made of a dielectric material, the method comprising:

arranging the various layers in the first conductor, the at least first core made of dielectric material, the at least one ground plane, and the at least one dielectric layer of the second conductor on one another in a desired order, arranging a cavity in the device, which extends from the first conductor through the at least a first core to the second conductor, and said cavity at right angles to the main direction from a particular conductive layer of the first conductor, up to and including that dielectric layer in the device on which the at least one conductive layer of the second conductor is to lie, arranging a component comprising a stripline conductor in the cavity, so that electrical contact is brought about between the stripline conductor of the component and the particular conductive layer in the first conductor, and arranging the at least one conductive layer, at least one remaining ground plane and dielectric layer of the second conductor on device so that electrical contact Is brought about between the stripline conductor of the component and the at least one conductive layer of the second conductor.

2. Method according to claim 1, wherein the first conductor in the device is a stripline conductor, and the second conductor in the device is a microstrip conductor or a stripline conductor.

3. Method according to claim 1, wherein the cavity in the device is formed by arranging each of the layers through which the cavity in the device is to extend, each layer having a respective cavity portion that is formed before each respective layer is mounted on the device, the location of the respective cavity portion in each layer corresponding to the location of the respective cavity in the other layers through which the cavity in the device is to extend.

4. Method according to claim 1, wherein the cavity is made in the device through the layers through which the cavity is to extend after said layers have been arranged on one another in the desired order.

5. Method according to claim 1, wherein the cavity and the component are designed so that, when the component includes a ground planes therein and is arranged in the cavity, each ground plane in the stripline conductor in the component interconnects ground planes in the first and the second conductor.

6. Method according to claim 1, wherein the component is an active device.

* * * * *